(12) United States Patent
Min et al.

(10) Patent No.: US 7,553,704 B2
(45) Date of Patent: Jun. 30, 2009

(54) ANTIFUSE ELEMENT AND METHOD OF MANUFACTURE

(75) Inventors: Won Gi Min, Chandler, AZ (US); Robert W. Baird, Gilbert, AZ (US); Jiang-Kai Zuo, Chandler, AZ (US); Gordon P. Lee, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 367 days.

(21) Appl. No.: 11/169,951

(22) Filed: Jun. 28, 2005

(65) Prior Publication Data

US 2006/0292754 A1 Dec. 28, 2006

(51) Int. Cl.
*H01L 21/82* (2006.01)
*H01L 21/336* (2006.01)
*H01L 21/31* (2006.01)

(52) U.S. Cl. .................. 438/131; 438/281; 438/762; 438/770; 438/981; 257/E21.625; 257/E29.133

(58) Field of Classification Search .............. 438/131, 438/281, 762, 770, 981; 257/E21.625
See application file for complete search history.

(56) References Cited

U.S. PATENT DOCUMENTS

| 4,553,314 | A | * | 11/1985 | Chan et al. | 438/250 |
|---|---|---|---|---|---|
| 5,087,950 | A | * | 2/1992 | Katano | 257/472 |
| 5,236,896 | A | * | 8/1993 | Nakamura et al. | 505/193 |
| 5,352,618 | A | * | 10/1994 | Larsen et al. | 438/264 |
| 5,416,072 | A | * | 5/1995 | Inada et al. | 505/193 |
| 5,679,968 | A | * | 10/1997 | Smayling et al. | 257/213 |
| 6,396,120 | B1 | | 5/2002 | Bertin et al. | |
| 6,753,590 | B2 | | 6/2004 | Fifield et al. | |
| 2004/0016991 | A1 | | 1/2004 | Johnson et al. | |
| 2004/0156234 | A1 | * | 8/2004 | Peng et al. | 365/177 |

\* cited by examiner

*Primary Examiner*—Charles D. Garber
*Assistant Examiner*—Ron E Pompey
(74) *Attorney, Agent, or Firm*—Ingrassia, Fisher & Lorenz, P.C.

(57) ABSTRACT

An antifuse element (102, 152, 252, 302, 352, 402, 602, 652, 702) and method of fabricating the antifuse element, including a substrate material (101) having an active area (106) formed in an upper surface, a gate electrode (104) having at least a portion positioned above the active area (106), and a gate oxide layer (110) disposed between the gate electrode (104) and the active area (106). The gate oxide layer (110) including the fabrication of one of a gate oxide dip (128) or a gate oxide undercut (614). During operation a voltage applied between the gate electrode (104) and the active area (106) creates a current path through the gate oxide layer (110) and a rupture of the gate oxide layer (110) in a rupture region (130). The rupture region (130) defined by the oxide structure and the gate oxide dip (128) or the gate oxide undercut (614).

13 Claims, 9 Drawing Sheets

ANTIFUSE ELEMENT AND METHOD OF MANUFACTURE

TECHNICAL FIELD OF THE INVENTION

The present invention generally relates to semiconductor integrated circuit technology, and more particularly to antifuse element structures, and a method of manufacturing antifuse elements, in semiconductor devices.

BACKGROUND OF THE INVENTION

One-time programmable non-volatile memories (OTP) have been widely used in read only memories (ROMs) for circuit trimming and can be realized using a circuit containing fuse or antifuse element structures. When a fuse element is utilized, the device is programmed by blowing fusible links at selected nodes to create an open circuit. The combination of blown and unblown links represents a digital bit pattern of ones and zeros signifying data that a user wishes to store in OTP. A high power is normally required (e.g. ~50 mA for a poly fuse link in a 0.25 um CMOS flow) to blow the link. In addition, a large area with supporting circuits is required. If the resultant opening formed in the circuit is not large enough, the disconnected blown links may become reconnected during long-term operation of the links, resulting in a circuit malfunction and reliability issues.

When an antifuse element is utilized, the programming mechanism is opposite the process of causing an open circuit in the fuse structure to be formed. Instead, the antifuse element programming mechanism creates a short circuit or a low resistance path. The antifuse element includes an insulating dielectric layer, such as a gate oxide, between two conducting layers. The unprogrammed state of an antifuse element is an open circuit with intact dielectric. The programmed state is a shorting path at a damaged point, known as the rupture point, in the dielectric/gate oxide formed by applying a voltage higher than the dielectric rupture voltage. It is known that, as the gate oxide in complementary metal oxide semiconductor (CMOS) flows becomes thinner (below 50 Å), many NMOS or PMOS types of structures are useful as antifuses, because the gate oxide rupture voltage/current becomes lower with thinner oxides resulting in a smaller trim circuit. Furthermore, spontaneous healing of a ruptured gate oxide is very unlikely, resulting in improved device reliability.

Typically, previous approaches to the inclusion of antifuse elements using CMOS type devices tie the source, drain, and body together as the bottom electrode, and the polysilicon gate as the top electrode. During programming, the rupture points can occur on the source side, drain side, or any point in a channel region formed under the polysilicon gate. This results in a relatively large resistance variation. In addition, when the rupture is located in the channel region under the gate, undesirable diode behavior may be measured between the polysilicon gate and silicon body, due to the opposite doping types. In general, previous antifuse elements are characterized by: (1) a program voltage higher than a low voltage CMOS transistor operation voltage; (2) long programming time (the charge-to-breakdown (QBD) is a function of gate oxide thickness, area and defects); and (3) large post program resistance and variation due to random rupture locations in the gate oxide.

Accordingly, it would be desirable to provide an antifuse element and a method of forming an antifuse element in which the rupture location is controlled and the local rupture electric fields are enhanced. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
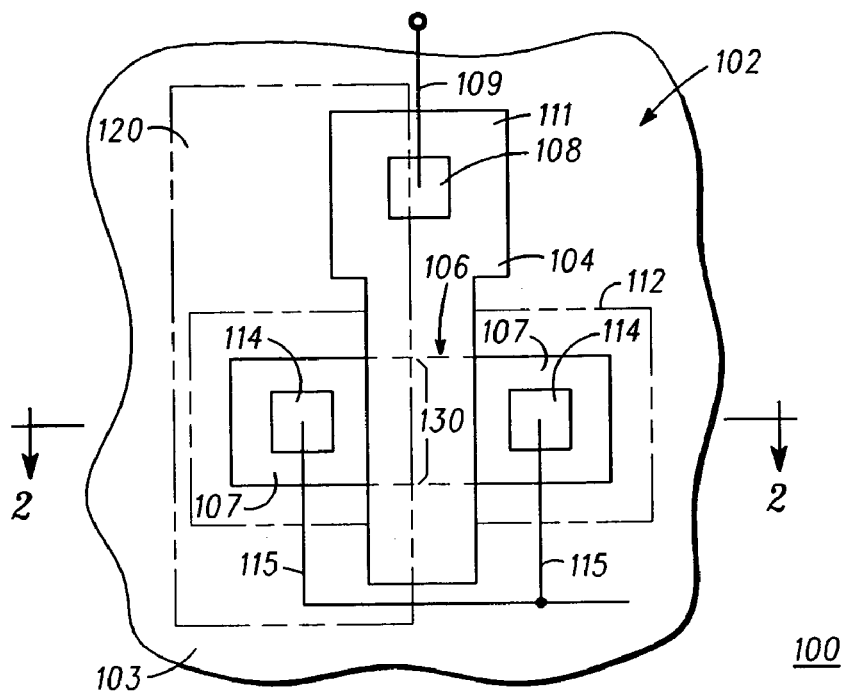
FIGS. 1-6 are top and cross-sectional schematic diagrams of an antifuse element in accordance with a first embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

In accordance with the present invention, there is provided an antifuse element utilizing a unique gate oxide and method of forming the antifuse element. The FIGs. included herein illustrate an antifuse built on a NMOS transistor, however, it should be understood that the antifuse element of the present invention can be built on a PMOS transistor or MOS capacitor.

Turning now to the drawings, FIGS. 1-6 are top and cross sectional views of an embodiment of an antifuse element according to the present invention. A semiconductor device 100, more particularly an antifuse element 102, is formed as a unique gate capacitor comprising a gate material and an active area formed in a substrate material 101, shown in FIG. 2, bounded by shallow trench isolation (STI) 103. Substrate material 101 may be a standard semiconductor substrate such as bulk or epitaxial silicon wafer. Antifuse element 102 is comprised of a top gate electrode 104 and an active area 106, which serves as a bottom electrode. Active area 106 includes source/drain N+ diffusion regions 107. The surface of active area 106 may include heavy diffusion contacts or well contacts 114 in the form of n-type or p-type implants to provide for good electrical contact.

Figure 2:
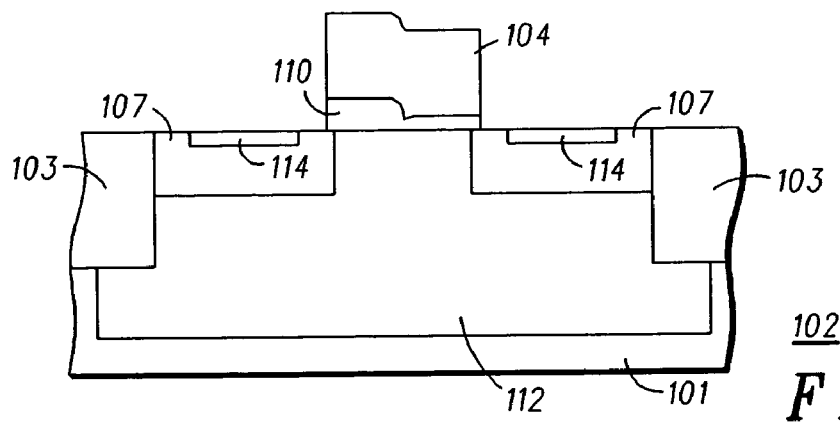

Gate electrode 104 may be formed of polysilicon and serves as a top electrode for antifuse element 102. Gate electrode 104 has a minimum width, usually submicron, which extends to overlay at least a portion of active area 106. In this preferred embodiment, gate electrode 104 is formed of an n-doped polysilicon material as is well known in the art and includes a contact 108 formed on an upper surface 111 thereof. A gate oxide 110, as shown in FIG. 2, is formed between gate electrode 104 and active area 106. In a preferred embodiment, gate oxide 110 is a dielectric material, such as any material suitable for an insulating layer. Gate electrode 104 is formed over gate oxide 110 and a portion of active area 106.

FIG. 2 illustrates an antifuse element 102 including a pwell 112, also shown in FIG. 1, formed in a surface of substrate material 101, to allow for gate electrode 104 to be n-doped, and source/drain implants 107 to be n-doped. In the alternative, antifuse element 102 may include an nwell 112, when gate electrode 104 is n-doped and thus a PMOS transistor. Contacts 114, in conjunction with an associated terminal 115 are formed proximate a rupture point (discussed below) of overlying gate electrode 104. It is a design goal to provide for minimum spacing between the rupture point of overlying gate electrode 104 and contacts 114 to allow for a lower programming voltage.

Referring again to FIG. 1, in one embodiment, device 100 is a CMOS device that functions as an antifuse by becoming conductive after undergoing programming. Prior to any programming event, wherein a voltage is applied between contacts 108 and 114, via a terminal 109 and terminals 115 respectively, the path between gate contact 108 and diffusion or well contacts 114 is an open circuit. Generally, the programming voltage is the voltage above the rupture voltage that will cause antifuse element 102 to change from an open state to a closed state, by causing a rupture (i.e. a breakdown of gate oxide 110 between gate electrode 104 and active area 106). During programming of antifuse element 102, a programming voltage is applied between gate electrode 104 and the active area, or bottom electrode, 106. The programming event creates a vertical current path between gate electrode 104 and active area 106, the bottom electrode. Rupture, or breakdown, of gate oxide 110, formed between, will occur at a rupture point 130 (FIG. 1) where the electric field is the highest. During programming, the highest electric fields will occur at an oxide dip (described below) below gate electrode 104 that overlies active region 106.

Figure 3:
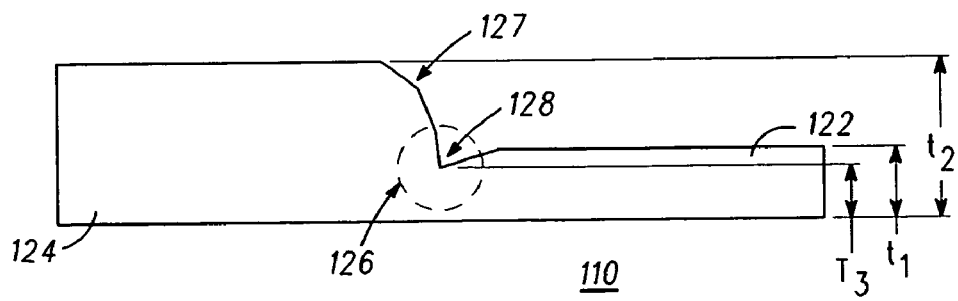

During the fabrication of antifuse element 102, a double gate oxide (DGO) mask layer, illustrated by dashed line 120 in FIG. 1 and described in detail below, covers a portion of gate electrode 104. In this particular embodiment, during fabrication, DGO mask layer 120 covers a left portion of gate electrode 104. Referring now to FIG. 3, as a result of the DGO process (described below), gate oxide 110 is described as including a structure comprised of a thin oxide portion 122 having a thickness ($T_1$) and a thick oxide portion 124 having a thickness ($T_2$), formed under gate electrode 104, wherein $T_1$ is less than $T_2$. The gate oxide will be stepped along and edge of the DGO mask that overlies the gate oxide. At an interface, or transition region, 126 between thin oxide portion 122 and thick oxide portion 124, there is an oxide dip 128 in gate oxide 110. Oxide dip 128 extends beneath gate electrode 104 as indicated by bracket 130 in FIG. 1. The thickness ($T_3$) of interface 126 is formed to be approximately 70% of the thickness ($T_1$) of thin oxide portion 122. Oxide dip 128 at transition region 126 is the most vulnerable part of gate oxide 110. During antifuse programming, the highest electric field is applied along oxide dip 128. The localization of the electric field promotes the gate rupture process at oxide dip 128 along rupture point or region 130 using a low program voltage, energy, and time.

Figure 4:
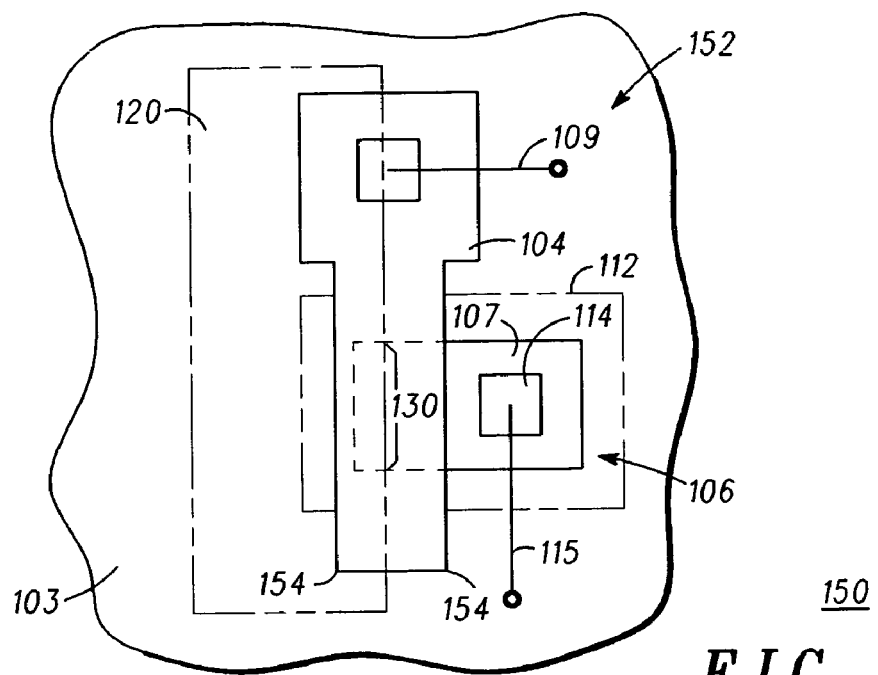
Figure 5:
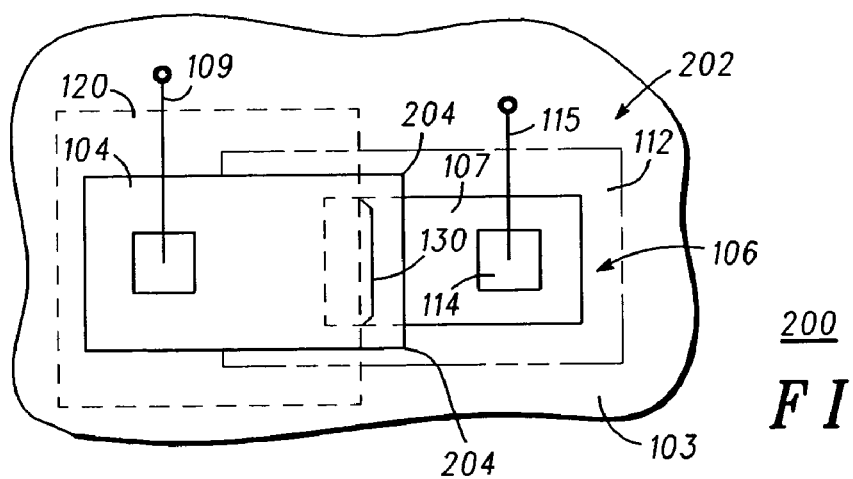
Figure 6:
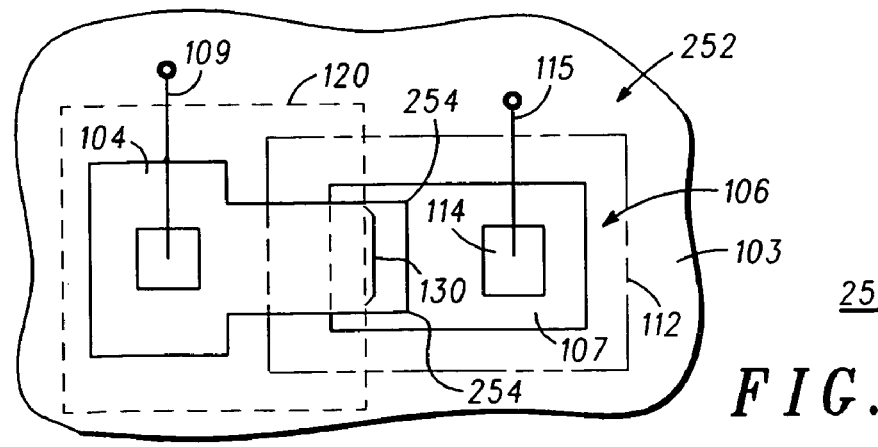

FIGS. 4-6 are top schematic views of various layouts for the antifuse element described in FIGS. 1-3. More specifically, FIG. 4 illustrates a portion of a device 150, including an antifuse element 152. Antifuse element 152 is formed similar to antifuse element 100 of FIGS. 1-3 having like numerals to indicate like elements. In addition, not all elements in FIGS. 4-6 that are similar to elements in FIGS. 1-3 will be described.

In the layout illustrated in FIG. 4, gate electrode 104 is positioned to extend over active area 106, which serves as the bottom electrode. Gate electrode 104 includes corners 154 that extend beyond active area 106, and overlay shallow trench isolation (STI) 103 (described in FIG. 1). A gate oxide (not shown), is formed between gate electrode 104 and active area 106. Gate electrode 104 is formed over the gate oxide on active area 106. A single contact 114, in conjunction with an associated terminal 115, serves as a bottom electrode contact. Contact 114 is formed proximate a rupture point 130 of overlying gate electrode 104. Similar to the device illustrated in FIG. 1, a DGO mask 120 is positioned over a left half of gate electrode 104 during fabrication of the insulating layer and the gate oxide dip (not shown). The gate oxide will be stepped along and edge of the DGO mask that overlies the gate oxide. A rupture region 130 as indicated by the bracket extends the length of the gate oxide dip is formed in the insulating material, similar to rupture region 130 of FIG. 1.

FIG. 5 illustrates another layout for an antifuse element and more particularly illustrates a portion of a device 200, including an antifuse element 202. Antifuse element 202 is formed similar to antifuse element 102 of FIGS. 1-3 having like numerals to indicate like elements, except in this particular embodiment, gate electrode 104 is oriented in a co-linear manner with respect to active area 106. In this particular layout of antifuse element 202, gate electrode 104 is positioned to extend over active area 106, which serves as the bottom electrode. Gate electrode 104 includes corners 204 that extend beyond active area 106, and overlay shallow trench isolation (STI) 103 (described in FIG. 1). A gate oxide (not shown), is formed between gate electrode 104 and active area 106. A single contact 114, in conjunction with an associated terminal 115, serves as a contact to active area 106. Contact 114 is formed proximate a rupture region 130 of overlying gate electrode 104. During fabrication of the gate oxide and gate oxide dip, a DGO mask 120 is positioned over a top portion of gate electrode 104 extending to a portion that overlies active area 106. The gate oxide will be stepped along and edge of the DGO mask that overlies the gate oxide. A rupture region 130 as indicated by the bracket extends the length of the gate oxide dip formed in the insulating material, similar to rupture region 130 of FIG. 1.

FIG. 6 illustrates yet another layout for an antifuse element and more particularly illustrates a portion of a device 250, including an antifuse element 252. Antifuse element 252 is formed similar to antifuse element 100 of FIGS. 1-3 having like numerals to indicate like elements. In this particular layout of antifuse element 252, gate electrode 104 is positioned to extend over active area 106 whereby a plurality of corners 254 of gate electrode 104 extend to overlay active area 106. In contrast to the embodiment illustrated in FIG. 5, corners 254 do not overlay shallow trench isolation (STI) 103 (described in FIG. 1). A gate oxide (not shown), is formed between gate electrode 104 and active area 106. A single contact 114, in conjunction with an associated terminal 115, serves as a contact to active area 106. Contact 114 is formed proximate a rupture point 130 of overlying gate electrode 104. During fabrication of the gate oxide and gate oxide dip, a DGO mask 120 is positioned over a top portion of gate electrode 104 extending to a portion that overlies active area 106. The gate oxide will be stepped along and edge of the DGO mask 120 that overlies the gate oxide. A rupture region 130 as indicated by the bracket extends the length of the gate oxide dip formed in the insulating material, similar to rupture region 130 of FIG. 1.

Figure 7:
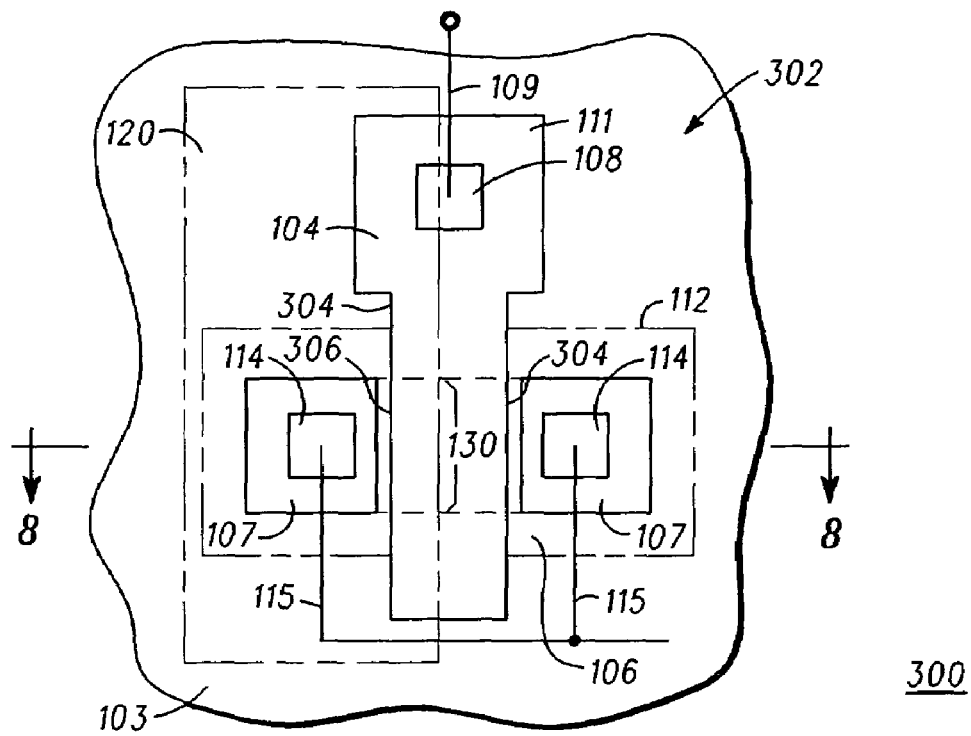
FIGS. 7-8 are a top schematic diagram and a cross-sectional schematic diagram of an antifuse element in accordance with a second embodiment of the present invention.
Figure 8:
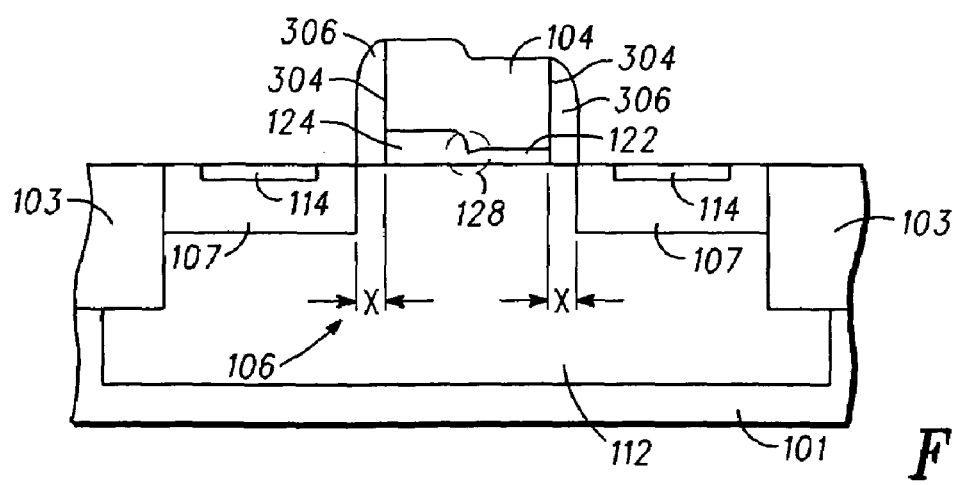

FIGS. 7-8 are top and cross-sectional schematic diagram of an antifuse element in accordance with a further embodiment of the present invention. A semiconductor device 300, and more particularly an antifuse element 302, is formed generally similar to antifuse element 100 of FIGS. 1-3 having like numerals to indicate like elements. In addition, not all elements in FIGS. 7-8 that are similar to elements in FIGS. 1-3 will be described.

FIG. 7 illustrates a top schematic diagram of a semiconductor device 300, and more specifically an antifuse element 302, including a DGO mask layer 120 utilized during fabrication. DGO mask layer 120 is formed to cover a left portion of gate electrode 104 and gate oxide 110 (FIG. 3) formed between gate electrode 104 and active area 106. The portion of gate oxide 110 covered by DGO mask 120 becomes a thick oxide portion during fabrication, similar to gate oxide portion 124 of FIG. 3. A portion of gate oxide 110 not covered by DGO mask 120 becomes a thin oxide portion during fabrication, similar to gate oxide portion 122 of FIG. 3. As best illustrated in FIG. 8, an NMOS transistor of this embodiment does not include a lightly doped drain (LDD) implant, and more specifically a source/drain N+ diffusion region, that extends active area 106 under gate electrode 104. Without the LDD implant, the source/drain N+ diffusion regions 107, or active areas 106 are spaced apart from a plurality of edges 304 of gate electrode 104. More specifically, gate electrode edges 304 are spaced apart from source/drain regions 107 by a distance "x". During programming, gate electrode 104 will not short to the active region 106 (N+ source/drain regions 107) due to this spacing. A spacer region 306 formed about gate electrode 104, provides protection from N+ source/drain implant regions 107.

During antifuse programming of device 300, the highest electric field is applied along region 130 of oxide dip 128 in the middle of gate electrode 104. The localization of the electric field promotes a gate rupture process at oxide dip 128 instead of in the proximity of active area 106, or the source/drain. In contrast to the previous embodiments, after gate oxide 128 is ruptured, a p-n junction diode is created between gate electrode 104 to source/drain areas 107. The junction diode will block unnecessary current of antifuse bit cells in a memory array during programming or reading sequence. Other means of forming a rectifying junction are anticipated, which need not be limited to a p-n structure.

Figure 9:
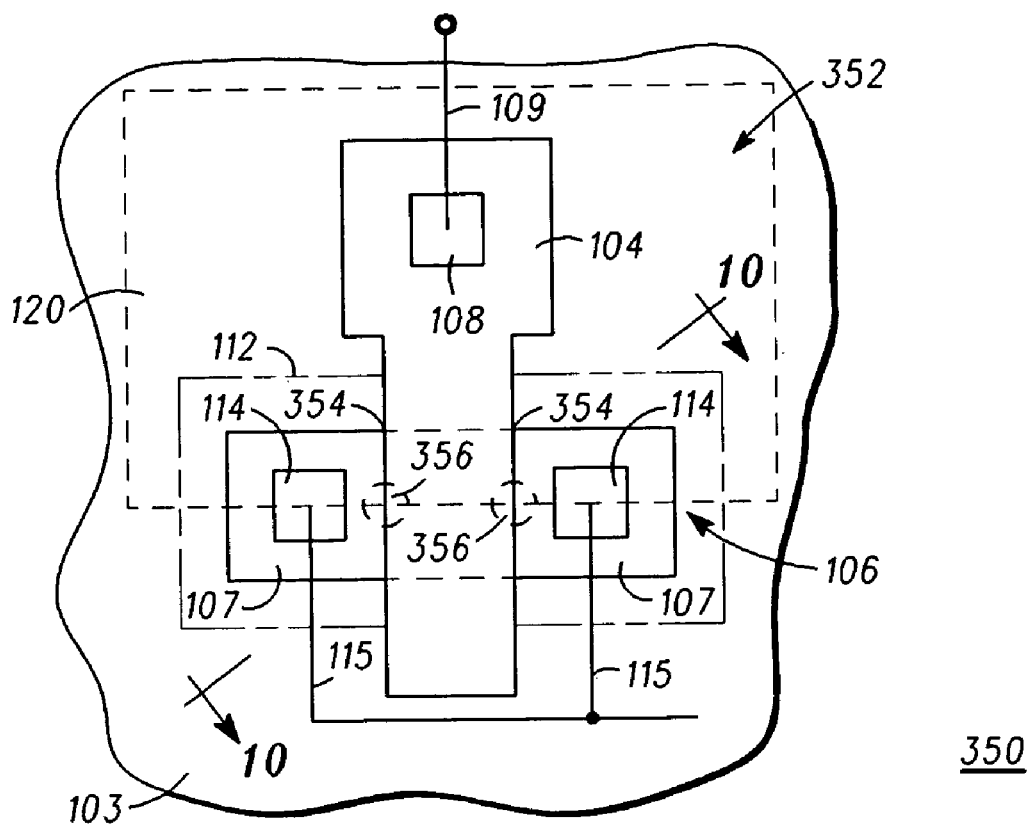
FIGS. 9-12 are top schematic diagrams and cross-sectional schematic diagrams of an antifuse element in accordance with a third embodiment of the present invention.
Figure 10:
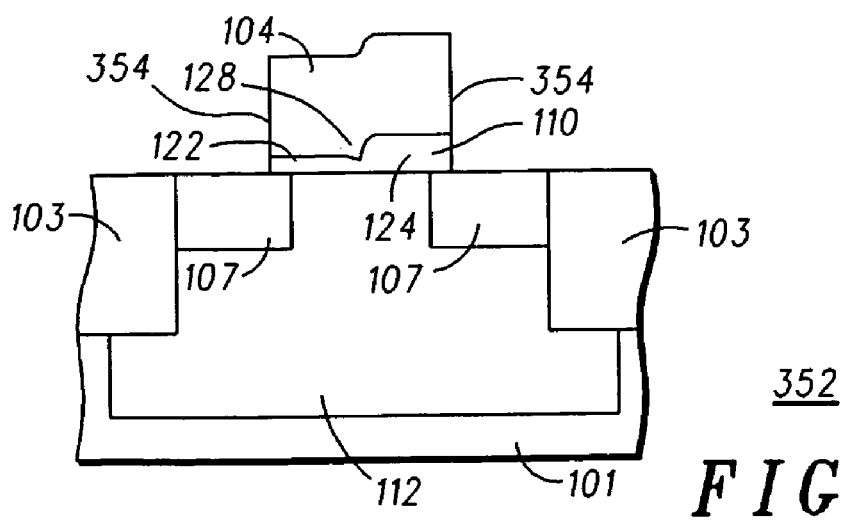
Figure 11:
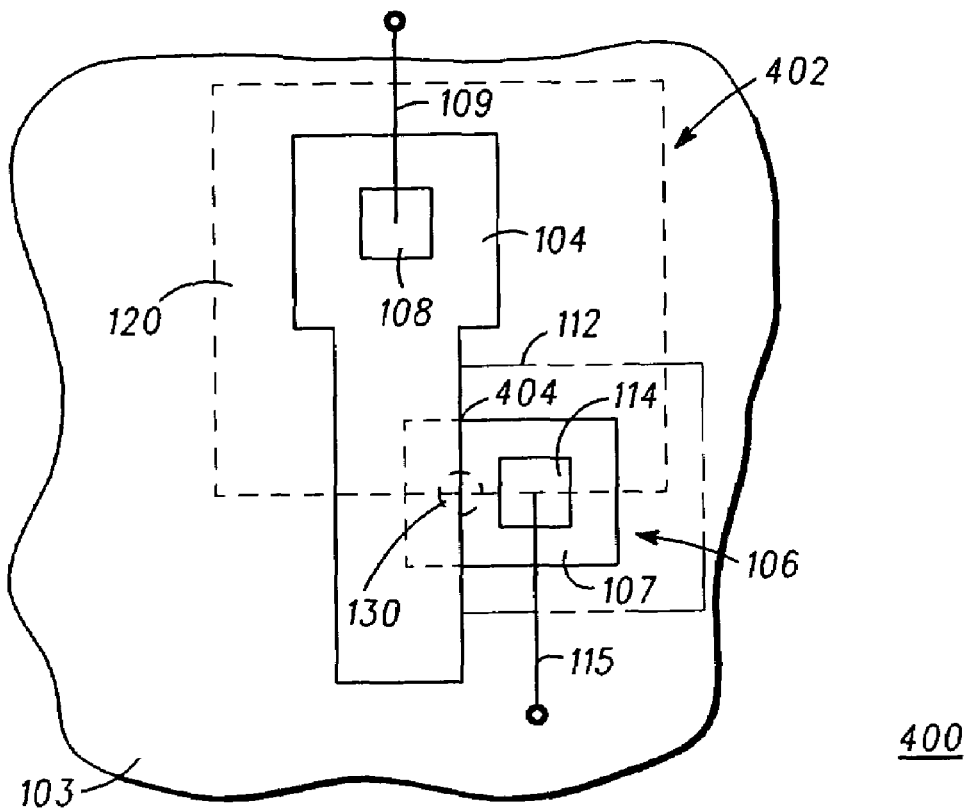
Figure 12:
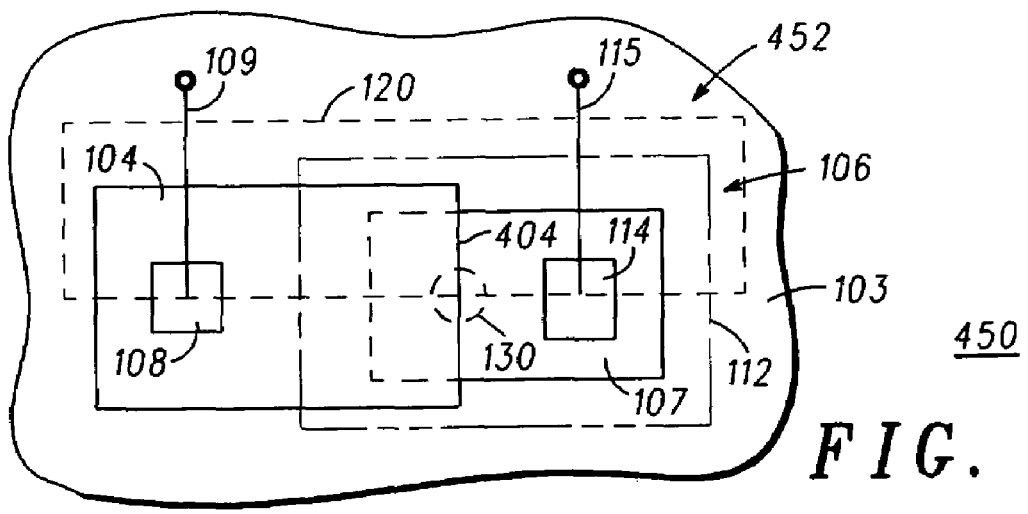
Figure 13:
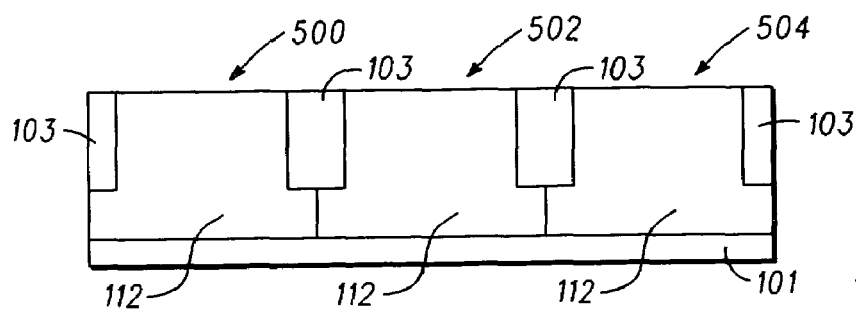
FIGS. 13-19 are cross-sectional schematic diagrams of a method of fabricating an antifuse element according to the present invention.

FIGS. 9-10 are top and cross sectional views of a portion of a semiconductor device 350, and more specifically an antifuse element 352, according to another embodiment of the invention. Antifuse element 352 is formed similar to antifuse element 102 of FIGS. 1-3 having like numerals to indicate like elements. In this particular embodiment, active areas 106, and more specifically, source/drain N+ regions 107, and gate oxide dip 128 cross at edges 354 of gate electrode 104. DGO mask layer 120 is formed to cover a top portion of gate electrode 104 and gate oxide 110 formed between gate electrode 104 and active area 106. The portion of gate oxide 110 covered by DGO mask 120 becomes a thick oxide portion during fabrication, similar to gate oxide portion 124 of FIG. 3. A portion of gate oxide 110 not covered by DGO mask 120 becomes a thin oxide portion during fabrication, similar to gate oxide portion 122 of FIG. 23. The gate oxide will be stepped along and edge of the DGO mask 120 that overlies the gate oxide. During antifuse programming, the highest electric field is applied at the crossing points, referenced 356, where edges 354 of gate electrode 104 cross source/drain areas 107 at gate oxide dip 128. The localization of the electric field promotes gate rupture process at crossing points 356 at low program voltage, energy, and time. In this particular embodiment, a low programming voltage antifuse 352 is fabricated without any additional processing steps or costs. L FIGS. 11 and 12 are top schematic views of various layouts for the antifuse element described in FIGS. 9-10. More specifically, FIG. 11 illustrates a portion of a device 400, including an antifuse element 402, and FIG. 12 illustrates a portion of a device 450, including an antifuse element 452. Antifuse elements 402 and 452 are formed similar to antifuse element 352 of FIGS. 9-10 having like numerals to indicate like elements. In addition, not all elements in FIGS. 11-12 that are similar to elements in FIGS. 9-10 will be described.

In the layouts illustrated in FIGS. 11 and 12, antifuse elements 402 and 452 each include a gate electrode 104, positioned to extend over active areas 106, which serve as the bottom electrodes. A gate oxide (not shown), is formed between gate electrodes 104 and active areas 106. Gate electrodes 104 are formed over the gate oxide and a portion of active areas 106. A single diffusion contact or well contact 114, in conjunction with an associated terminal 115, serves as a bottom contact in each antifuse element. Contact 114 is formed proximate a rupture region 130. Similar to the device illustrated in FIG. 1, a DGO mask 120 is positioned over gate electrode 104 during fabrication of the insulating layer and the gate oxide dip (not shown). The portion of the gate oxide covered by DGO mask 120 becomes a thick oxide portion during fabrication, similar to gate oxide portion 124 of FIG. 3. A portion of the gate oxide not covered by DGO mask 120 becomes a thin oxide portion during fabrication, similar to gate oxide portion 122 of FIG. 3. The gate oxide will be stepped along and edge of the DGO mask 120 that overlies the gate oxide. In the embodiments illustrated, source/drain areas 107, more particularly the source/drain N+ area, and a gate oxide dip 128 each cross at one edge 404 of gate electrode 104. During antifuse programming, the highest electric field is at the intersection of gate oxide dip 128 and edge 404 of gate electrode 104, and more particularly at a crossing point, or rupture region 130.

FIGS. 13-19 are cross-sectional schematic diagrams of a method of fabricating an antifuse element according to the present invention. More specifically, FIGS. 13-19 illustrate a method of fabricating antifuse element 102 of FIGS. 1-6. It should be understood that the method described and illustrated in FIGS. 13-19 can also be used to fabricate an antifuse element similar to the antifuse elements described with respect to FIGS. 7-12.

FIGS. 13 through 19 illustrate the fabrication steps of a plurality of devices, including a logic CMOS device 500, a high voltage device 502, and an antifuse element 504 generally similar to antifuse element 102 of FIG. 1. These process steps are offered by way of example of one method for reduction to practice of conceived embodiments. Other methods are anticipated as would be obvious to one skilled in the art, and the scope of this description is not intended to be limited to this general process description. A substrate 101 is provided having a plurality of pwells 112 formed therein. Substrate material 101 may be a standard semiconductor substrate such as bulk or epitaxial silicon substrate and is intended to encompass the relatively pure silicon materials typically used in the semiconductor industry, silicon-on-insulator, as well as silicon add-mixed with other elements such as germanium and the like. In addition, other suitable substrate materials, such as substrates including III-V and II-VI materials may be considered in specific instances depending on device requirements. STI 103 provides separation between CMOS device 500, high voltage device 502, and antifuse element 504.

Figure 14:
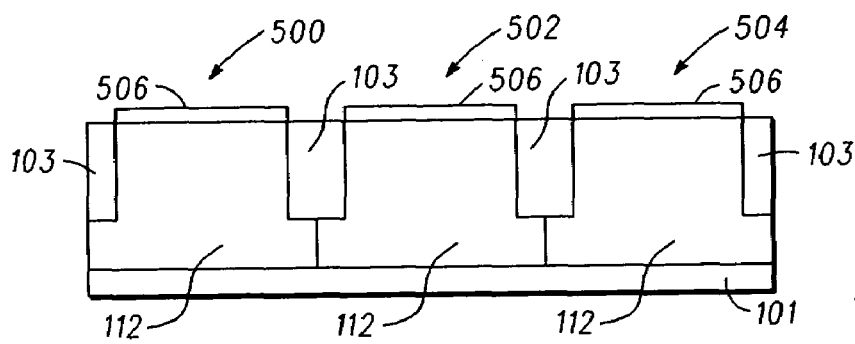
Figure 15:
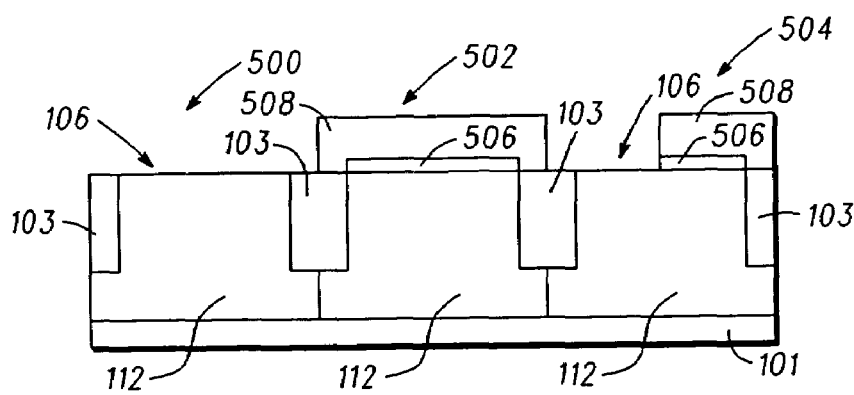

Subsequent to the formation of STIs 103 and pwells 112, a thick insulating layer 506 is formed over the entire substrate 101 as illustrated in FIG. 14. Thick insulating layer 506 is typically formed of silicon nitride, silicon oxide, or other similar insulating materials. Thick insulating layer 506 is next patterned using a mask layer 508 such that thick insulating layer 506 over an active area of logic CMOS device 500 is totally removed. Thick insulating layer 506 formed over the active area of high voltage device 502 is protected by mask layer 508 as illustrated in FIG. 15. A portion of thick insulating layer 506 formed on an active area of antifuse element 504, similar to active area 106 of antifuse element 102 (FIG. 1) is etched way. Next, mask layer 508 is removed.

Figure 16:
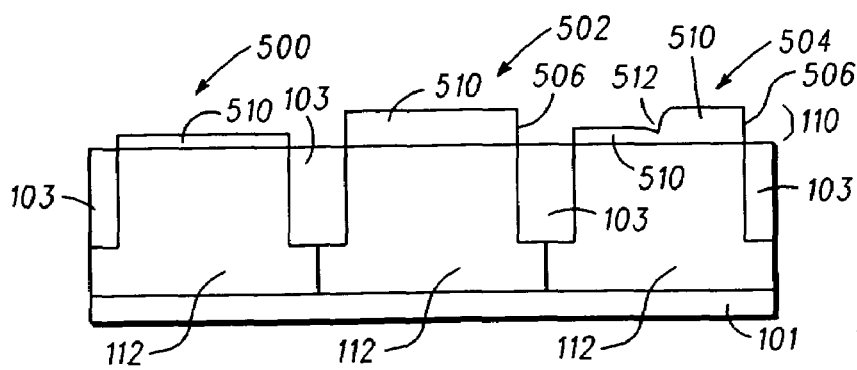
Figure 17:
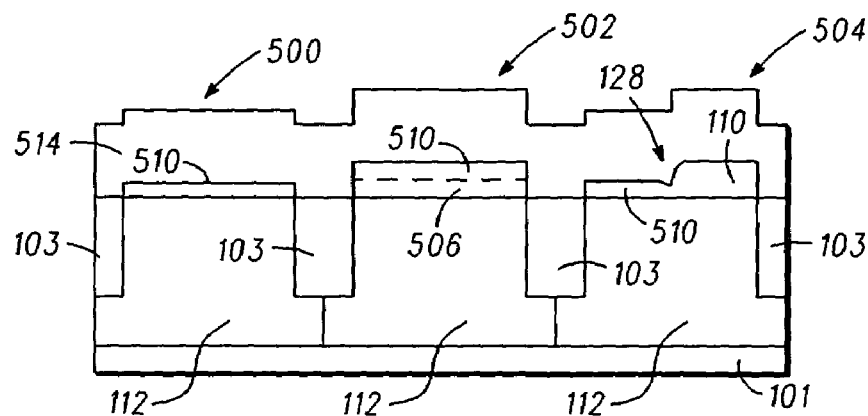
Figure 18:
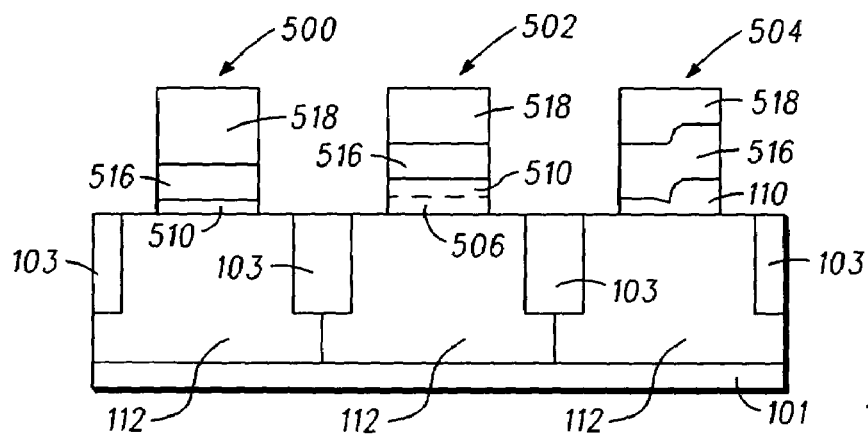
Figure 19:
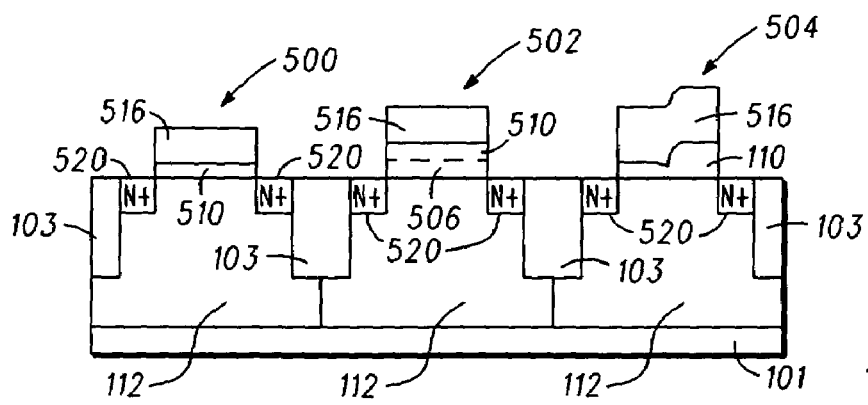

FIG. 16 illustrates a thin oxide layer 510 that is next grown over the active area of logic CMOS device 500, high voltage device 502, and antifuse element 504. The remaining steps outline a flow where layer 506 has been formulated as a thick oxide layer. In the active area of high voltage device 502, and a portion of antifuse element 504, thin oxide layer 510 is grown on the previous grown thick oxide layer 506. Due to the surface of substrate 101 in the active area of high voltage device 502 being covered by thick oxide layer 506, a layer of thin oxide 510 will grow at a slower speed than layer of thin oxide 510 in an active area of logic CMOS device 500. The resultant oxide layers in active area 106 of antifuse element 504 serve as a gate oxide. Thin oxide layer 510 and thick oxide layer 506 form a gate oxide for antifuse element 504, generally similar to gate oxide 110 of FIG. 1. Gate oxide 110 has a structure formed by thin oxide layer 510 and thick oxide layer 506 as shown in FIG. 16. Gate oxide 110 has a dip 512 at the interface, similar to gate oxide dip 128 of FIGS. 1-3, at a transition area formed by thin oxide layer 510 and thick oxide layer 506. Gate oxide dip 512 is formed by the slow oxidation speed at the surface of substrate 101 close to edge of thick gate oxide 506 due to the oxygen supply being blocked by a side wall of thick gate oxide 506. The thickness of the oxide at dip 512 is about 70% of the thickness of thin oxide layer 510. To complete the fabrication of CMOS device 500, high voltage device 502, and antifuse element 504, a layer of polysilicon 514 is deposited on the surface of the devices as illustrated in FIG. 17. A mask layer 518 is next deposited providing for subsequent patterning and etching of polysilicon layer 514 and fabrication of gates 516 as illustrated in FIG. 18. The formation of source and drain implants 520 follows, as illustrated in FIG. 19 to form source and drain regions for CMOS device 500, high voltage device 502, and antifuse element 504.

Figure 20:
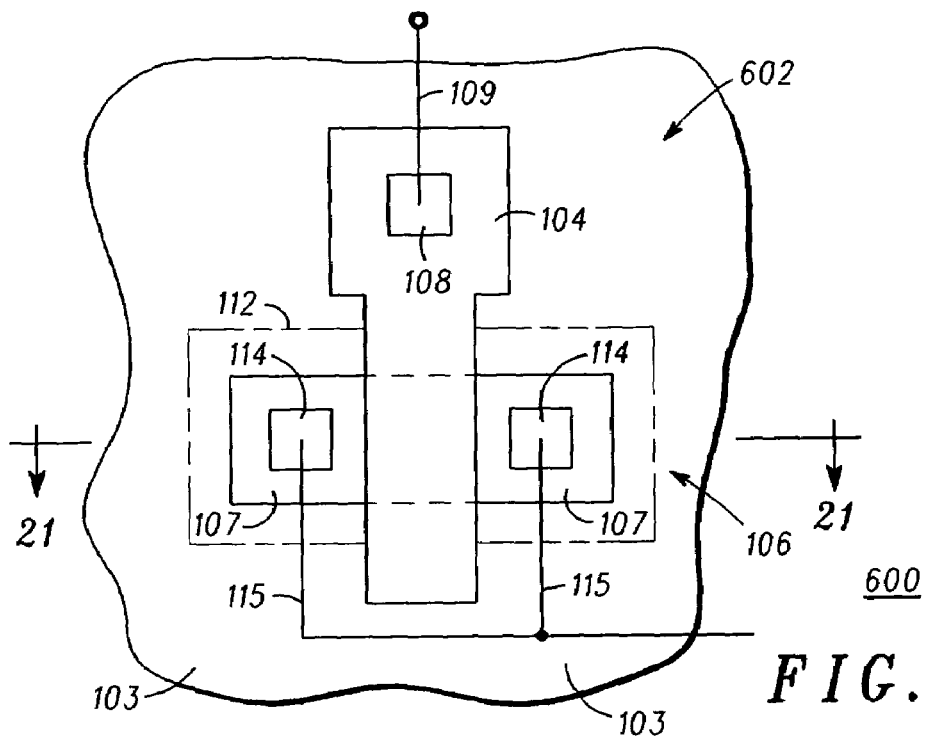
FIGS. 20-24 are top schematic diagrams and cross-sectional schematic diagrams of an antifuse element in accordance with a further embodiment of the present invention.
Figure 21:
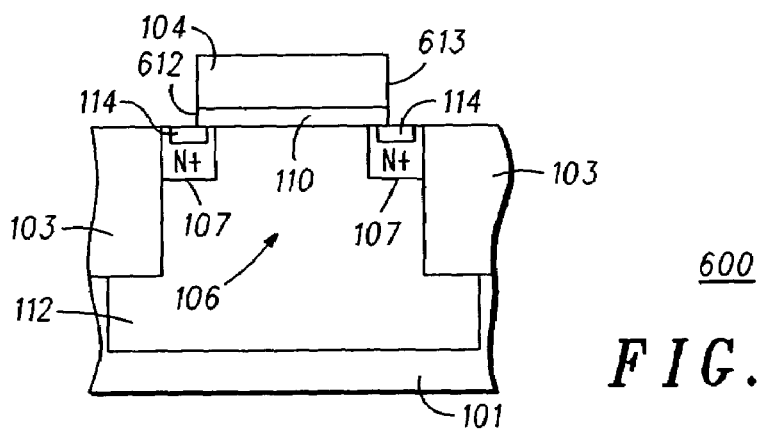
Figure 22:
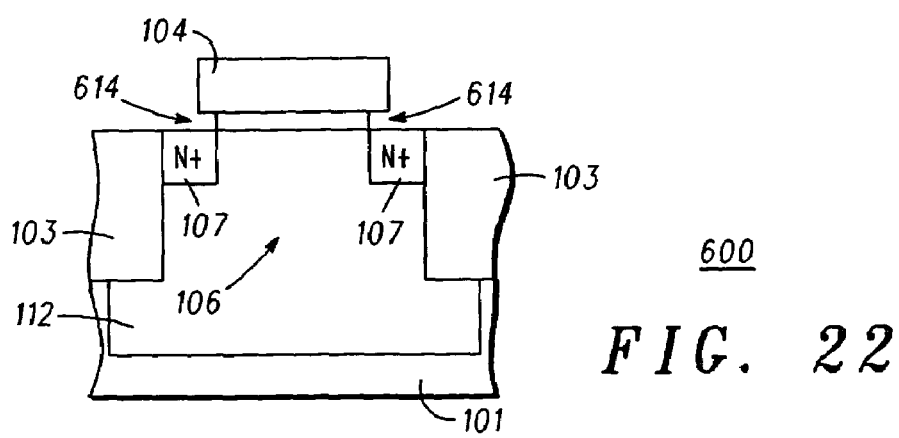

FIGS. 20-22 are top and cross-sectional schematic diagrams of a MOS device manufactured in accordance with an alternative fabrication process. More specifically, FIGS. 20-22 illustrate a portion of a device 600, including an antifuse element 602. Antifuse elements 602 is formed similar to antifuse element 102 of FIGS. 1-6 having like numerals to indicate like elements. In addition, not all elements in FIGS. 20-22 that are similar to elements in FIGS. 1-6 will be described.

MOS device 600 is comprised of an antifuse element 602 including a controlled gate oxide undercut 614 (FIG. 22) that is fabricated to allow for a low rupture voltage, decreased programming power, decreased programming resistance and variation, and decreased programming time.

Antifuse element 602 is fabricated generally similarly to antifuse element 102 (FIGS. 1-3) using standard fabrication techniques well know in the art, except in this particular embodiment, a gate oxide layer 110 is formed as a single layer with a subsequent undercut technique applied. Antifuse element 602 comprises a gate material and an active area formed in a substrate material 101, bounded by shallow trench isolation (STI) 103. More specifically, antifuse element 602 comprises a gate conductor or gate electrode 104, an active area 106, a gate contact 108, and an insulative material 110 positioned between gate electrode 104 and active area 106. Antifuse element 102 further includes a P well 112 and a plurality of pwell contacts 114. FIG. 21 illustrates one step during fabrication, wherein a plurality of side edges 612 of gate oxide 110 are aligned with a plurality of edges 613 of gate electrode 104.

As stated previously antifuse element 602 is fabricated in generally the same manner as a conventional antifuse element, except that additional photolithography and etch steps are performed during fabrication of antifuse element 602 to provide for gate oxide undercut 614 about a perimeter of gate electrode 104 as illustrated in FIG. 22. More specifically, subsequent to the definition of gate electrode 104, a photoresist is deposited and patterned to open antifuse element 602 and to expose gate electrode 104. Gate oxide 110 is etched with an oxide etching solution, such as dilute HF or BOE, under the edge of gate electrode 104 to form a gate oxide undercut. The gate oxide of an associated logic CMOS device (not shown) is protected by the photoresist. Finally, any remaining photo resist layer on the surrounding logic CMOS device is stripped away prior to further source and drain implant procedures and additional back-end processes to complete the device. Accordingly, the fabrication of antifuse element 604 to include undercut 614 requires one extra mask and etch step that is compatible with standard CMOS processing.

Figure 23:
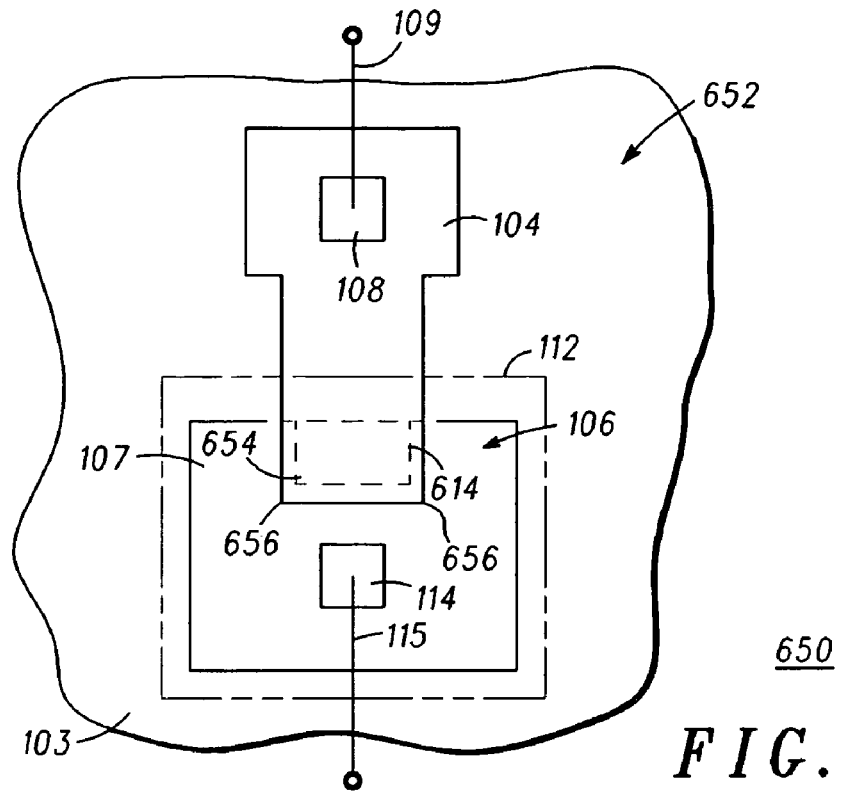

FIG. 23 illustrates another embodiment of a portion of a device 650, including an antifuse 652. Antifuse element 652 includes an undercut gate oxide 614 according to the present invention. Antifuse element 652 is formed similar to antifuse element 100 of FIGS. 1-3 having like numerals to indicate like elements. In addition, not all elements in FIG. 23 that are similar to elements in FIGS. 1-3 will be described.

During fabrication of device 650 of FIG. 23, a trench process and implant technique are performed on a substrate, such as a silicon wafer, to define active area 106 and an nwell 112. Subsequent growth of a gate oxide on active area 106 and gate material deposition (i.e. polysilicon) are performed to form a MOS structure and gate electrode 104 having an insulating gate oxide material 110 formed between. Gate electrode 104 is fabricated so that an end portion 654 overlays active area 106. An nwell contact 114 is fabricated as near as possible to the overlying end portion 654 to minimize a post program conducting path. Source and drain implants, inter-dielectric layer deposition, contact etch, and additional back-end processes are performed to complete antifuse element 652.

Antifuse 650 comprises a special gate capacitor and includes electrode 104 extending into the gate oxide (not shown) in active area 106 under which is a highly doped nwell or pwell 112 having the same doping type as polysilicon electrode 104. Normally, an nwell 112 is desired because it results in a lower resistance path after the gate oxide is ruptured. Active region 106, which acts as a bottom electrode, is in contact with nwell 112, and more particularly diffusion contacts 114, near an end 654 of electrode 104 with a minimum allowed spacing. This arrangement has two distinguishing advantages: (1) the rupture region in programming is at a plurality of end corners 656 of electrode 104 having the closest conducting path to nwell contact 114 because of the strongest electric fields. This will give not only a low shorting-path resistance but also a tight distribution; (2) a plurality of electrodes can be densely packed in parallel.

As stated previously antifuse element 652 of FIG. 23 is fabricated in generally the same manner as a conventional antifuse element, except for the addition of a photolithography and etch step to provide for a gate oxide undercut 614 about a perimeter of a gate electrode 104. More specifically, subsequent to the definition of gate electrode 104, a photoresist is deposited and patterned to open antifuse element 652 and to expose antifuse gate electrode 104. Gate oxide 110 is etched with an oxide etching solution, such as dilute HF or BOE, under the edge of gate electrode 104 to form gate oxide undercut 614. The gate oxide of an associated logic CMOS device (not shown) is protected by the photoresist. Finally, any remaining photo resist layer on the surrounding logic CMOS device is stripped away prior to further source and drain implant procedures and additional back-end processes to complete the device. Accordingly, the fabrication of antifuse element 652 to include undercut 614 requires one extra mask and etch step that is compatible with standard CMOS processing.

The degree of gate oxide undercut 614 is device specific and dependent upon the reliability requirement for unprogrammed antifuse element 652. Gate oxide undercut 614 results in a localization of the gate oxide rupture at undercut 614. Undercut 614 further reduces the rupture (breakdown in insulating material 110), and therefore further reduction in the required programming voltage, lower post program resistance and variation, and faster programming at the lower power.

Figure 24:
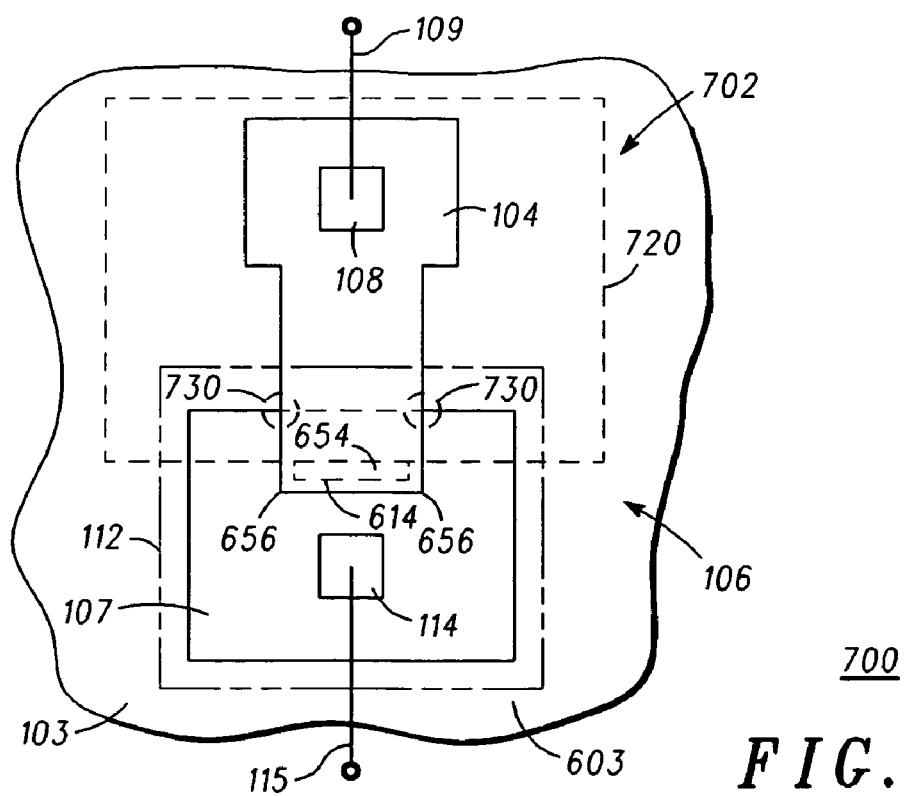

FIG. 24 illustrates a further embodiment of a portion of a semiconductor device 700, including an antifuse element 702. Antifuse element 700 is formed similar to antifuse element 100 of FIGS. 1-3 having like numerals to indicate like elements. In addition, not all elements in FIG. 24 that are similar to elements in FIGS. 1-3 will be described. During fabrication, an upper portion of a top gate electrode 104 is covered by an undercut masking layer 720, while an end portion 654 of a gate electrode 104 is not covered. During an etch step, only a selective portion of the gate oxide (as indicated by the highlighted portion 614) along end 654 of gate electrode 104 is undercut because it is not covered by a photoresist, such as undercut masking layer 720. In this method of forming an antifuse element, the gate oxide near a plurality of shallow trench isolation (STI) regions 103 can be protected. The gate oxide near STI 103 is prone to being thinner than the oxide on an inside of active area 106. If the gate oxide near STI 103 is undercut, gate rupture may happen at the STI 103/gate oxide border 730 during programming. Undercut masking layer 720 provides gate oxide undercut at end portion 654 of gate electrode 104 over active area 106. This method of fabricating the gate oxide promotes the rupture at end portion 654, STI 103/gate oxide border 730, or corners 656 of gate electrode 104 so that the post program resistance and variation can be minimized.

The degree of gate oxide undercut 614 is device specific and dependent upon the reliability requirement for unprogrammed antifuse element. Gate oxide undercut 614 results in a localization of the gate oxide rupture at undercut 614. Undercut 614 further reduces the rupture (breakdown in insulating material), and therefore further reduction in the required programming voltage, lower post program resistance and variation, and faster programming at the lower power.

Accordingly, provided is an antifuse element comprising: a substrate material having an upper surface; an active area, and including a source/drain area, formed in the upper surface of the substrate material; a gate electrode having at least a portion positioned above the active area; and a gate oxide layer including one of a gate oxide dip or a gate oxide undercut, the gate oxide layer disposed between the gate electrode and the active area such that a voltage between the gate electrode and the active area creates a current path through the gate oxide layer and a rupture of the gate oxide layer in a rupture region. In one embodiment of the antifuse element the substrate material is a semiconductor material. The active area comprises an electrically conductive doped region. In one embodiment, the gate electrode includes a plurality of sidewalls and wherein each of the sidewalls overlaps the active area. In one embodiment, the gate oxide layer is comprised of a thin oxide portion having a thickness $T_1$ and a thick oxide portion having a thickness $T_2$, wherein $T_1$ is less than $T_2$, the gate oxide dip defined by a transition area between the thin oxide portion and the thick oxide portion. The gate oxide dip has a thickness in a range of 60-80% of a thickness of the thin oxide portion. In one embodiment, the rupture region of the gate oxide layer extends along a length of the gate oxide dip formed beneath the gate electrode. The rupture region is located at a point where the gate oxide dip overlaps the source/drain area and the closest conducting path to a plurality of contacts of the active area. In one embodiment, the gate electrode does not overlap the source/drain area and a diode is formed subsequent to a rupture of the gate oxide. In one embodiment, the gate oxide undercut is formed in the gate oxide layer about a perimeter of the gate oxide layer positioned beneath the gate electrode. The gate oxide undercut is formed about a portion of a perimeter of the gate electrode.

Next, provided is a method of fabricating an antifuse element, the method comprising: providing a substrate material having an upper surface; implanting an active area, including a source/drain area, in the upper surface of the substrate material; forming a gate electrode having at least a portion positioned above the active area; and forming a gate oxide layer including one of a gate oxide dip or, a gate oxide undercut, the gate oxide layer disposed between the gate electrode and the active area such that a voltage between the gate electrode and the active area creates a current path through the gate oxide layer and a rupture of the gate oxide layer. The step of forming a gate oxide layer includes forming a gate oxide layer having a thick oxide portion having a thickness $T_2$ and a thin oxide portion having a thickness $T_1$, wherein $T_1$ is less than $T_2$, wherein a gate oxide dip is formed at a transition area where the thin oxide portion and the thick oxide portion intersect. The thick oxide portion and the thin oxide portion of the gate oxide layer are formed using a double gate oxide mask. In one embodiment, the step of forming a gate oxide layer includes depositing a first insulating layer over the substrate material, etching away a portion of the first insulating layer to expose a portion of the substrate material, and depositing a second insulating layer, wherein a portion of the second insulating layer is deposited over the first insulating layer and a portion is deposited over the exposed portion of the substrate material, thereby defining a gate oxide layer structure including the gate oxide dip. In one embodiment, the step of forming a gate oxide layer includes undercutting the gate oxide layer about a perimeter of the gate electrode. In one embodiment, the step of forming a gate oxide layer includes masking at least a portion of the gate electrode and exposing the gate oxide layer to an undercut etch about at least a portion of a perimeter of the gate electrode.

Finally, provided is a method of fabricating an antifuse element, the method comprising: providing a substrate material having an upper surface; implanting a plurality of active areas in an upper surface of the substrate material thereby forming a source region and a drain region; forming a gate electrode having at least a portion positioned above the active area; and forming a gate oxide layer including a gate oxide dip formed in a transition area of the gate oxide layer, the gate oxide layer disposed between the gate electrode and the active area such that a voltage between the gate electrode and the active area creates a current path through the gate oxide layer and a rupture of the gate oxide layer. In one embodiment, the step of forming a gate oxide layer includes depositing a first insulating layer over the substrate material, etching away a portion of the first insulating layer to expose a portion of the substrate material, and depositing a second insulating layer, wherein a portion of the second insulating layer is deposited over the first insulating layer and a portion is deposited over the exposed portion of the substrate material, thereby defining a gate oxide structure including the gate oxide dip. In one embodiment, the step of forming a gate electrode includes depositing a conductive material over the gate oxide structure wherein a plurality of sidewalls of the gate electrode overlap at least a portion of the active area.

While a plurality of exemplary embodiments have been presented in the foregoing detailed description, it should be appreciated that additional variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method of fabricating an antifuse element, the method comprising:
   providing a substrate material having an upper surface;
   implanting an active area in the upper surface of the substrate material;
   forming a gate electrode having at least a portion positioned above the active area;
   forming a gate oxide layer including a thin oxide portion and a thick oxide portion, the gate oxide layer disposed between the gate electrode and the active area; and
   forming a gate oxide dip including a thickness $T_1$ less than the thin oxide portion and the thick oxide portion along an interface between the thin oxide portion and the thick oxide portion.

2. The method of fabricating an antifuse element as claimed in claim 1 wherein the step of forming the gate oxide layer includes forming the thick oxide portion with a thickness $T_2$ and forming the thin oxide portion with a thickness $T_3$, wherein $T_3$ is less than $T_2$.

3. The method of fabricating an antifuse element as claimed in claim 2 wherein the step of forming the gate oxide layer includes forming the thick oxide portion and the thin oxide portion of the gate oxide layer using a double gate oxide mask.

4. The method of fabricating an antifuse element as claimed in claim 3 wherein the step of forming the gate oxide layer includes depositing a first insulating layer over the substrate material, etching away a portion of the first insulating layer to expose a portion of the substrate material, and depositing a second insulating layer, wherein a portion of the second insulating layer is deposited over the first insulating layer and a portion is deposited over the exposed portion of the substrate material, thereby defining the gate oxide layer structure including the gate oxide dip.

5. The method of fabricating an antifuse element as claimed in claim 1 wherein the step of forming the gate oxide layer includes undercutting the gate oxide layer about a perimeter of the gate electrode.

6. The method of fabricating an antifuse element as claimed in claim 1 wherein the step of forming the gate oxide layer includes masking at least a portion of the gate electrode and exposing the gate oxide layer to an undercut etch about at least a portion of a perimeter of the gate electrode.

7. A method of fabricating an antifuse element, the method comprising:
   providing a substrate material having an upper surface;
   implanting a plurality of active areas in an upper surface of the substrate material thereby forming a source region and a drain region;
   forming a gate electrode having at least a portion positioned above at least one active area of the plurality of active areas;
   forming a gate oxide layer including a thick portion and a thin portion; and
   forming a gate oxide dip in a transition area between the thick portion and the thin portion of the gate oxide layer, the gate oxide layer disposed between the gate electrode and the active area and including a thickness less than the thick portion and the thin portion.

8. The method of fabricating an antifuse element as claimed in claim 7 wherein the step of forming the gate oxide layer comprises:
   depositing a first insulating layer over the substrate material;
   etching away a portion of the first insulating layer to expose a portion of the substrate material; and
   depositing a second insulating layer, wherein a portion of the second insulating layer is deposited over the first insulating layer and a portion is deposited over the exposed portion of the substrate material, thereby defining a gate oxide structure including the gate oxide dip.

9. The method of fabricating an antifuse element as claimed in claim 8 wherein the step of forming the gate electrode includes depositing a conductive material over the gate oxide structure, wherein a plurality of sidewalls of the gate electrode overlap at least a portion of the active area.

10. The method of claim 2, wherein the step of forming the gate oxide dip comprises the step of forming the gate oxide dip with about 70% of the thickness of $T_3$.

11. The method of claim 1, wherein the step of forming the gate oxide layer comprises the step of growing the thin oxide portion at a slower speed than the thick oxide portion.

12. The method of claim 11, wherein the step of forming the gate oxide dip comprises the steps of blocking, via the thick oxide portion, a supply of oxygen from reaching the interface between the thick oxide portion and the thin oxide portion during growth of the thick oxide portion and the thin oxide portion.

13. The method of claim 7, wherein the step of forming the gate oxide dip comprises the step of forming the gate oxide dip with about 70% of the thickness of the thin portion.

* * * * *